(12) United States Patent
Lang et al.

(10) Patent No.: US 12,141,467 B2
(45) Date of Patent: Nov. 12, 2024

(54) CROSS-TEMPERATURE MITIGATION IN A MEMORY SYSTEM

(71) Applicant: Micron Technology, Inc., Boise, ID (US)

(72) Inventors: Murong Lang, San Jose, CA (US); Christina Papagianni, San Jose, CA (US); Zhenming Zhou, San Jose, CA (US); Ting Luo, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 59 days.

(21) Appl. No.: 17/868,085

(22) Filed: Jul. 19, 2022

(65) Prior Publication Data
US 2024/0028248 A1    Jan. 25, 2024

(51) Int. Cl.
*G06F 3/06* (2006.01)
(52) U.S. Cl.
CPC .......... *G06F 3/0655* (2013.01); *G06F 3/0604* (2013.01); *G06F 3/064* (2013.01)
(58) Field of Classification Search
CPC ....... G06F 3/0655; G06F 3/0604; G06F 3/064
USPC .................................. 711/154, 100
See application file for complete search history.

(56) References Cited

U.S. PATENT DOCUMENTS

| | | | |
|---|---|---|---|
| 2015/0178001 A1* | 6/2015 | Chien | G06F 3/064 711/102 |
| 2020/0159410 A1* | 5/2020 | Rayaprolu | G06F 3/0679 |
| 2020/0387323 A1* | 12/2020 | Boehm | G06F 11/1076 |
| 2021/0165703 A1* | 6/2021 | Rayaprolu | G06F 11/3058 |
| 2021/0263821 A1* | 8/2021 | Yang | G11C 29/021 |

* cited by examiner

*Primary Examiner* — David Yi
*Assistant Examiner* — Zubair Ahmed
(74) *Attorney, Agent, or Firm* — Holland & Hart LLP

(57) ABSTRACT

Methods, systems, and devices for cross-temperature mitigation in a memory system are described. A memory system may determine a first temperature of the memory system. Based on the first temperature satisfying a first threshold, the memory system may write a set of data to a first block of the memory system that is configured with a first rate for performing scan operations to determine error information for the first block. The memory system may then determine a second temperature of the memory system after writing the set of data to the first block. Based on the second temperature satisfying a second threshold, the memory system may transfer the set of data to a second block of the memory system that is configured with a second rate for performing scan operations to determine error information for the second block.

21 Claims, 6 Drawing Sheets

CROSS-TEMPERATURE MITIGATION IN A MEMORY SYSTEM

FIELD OF TECHNOLOGY

The following relates to one or more systems for memory, including cross-temperature mitigation in a memory system.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

A memory system that stores data may perform access operations on the data at different temperatures. For example, a memory system may write a set of data at a first temperature, which may be referred to as the write temperature, and may read the set of data at a second temperature, which may be referred to as the read temperature. The difference between the write temperature for a set of data and the read temperature for the set of data may be referred to as the cross temperature (e.g., a temperature differential). As a cross temperature increases, the reliability of the memory system may suffer or be compromised. For example, the memory system may misread data due to changes in memory cells (e.g., threshold voltage changes) that occur, at least in part, due to the cross temperature. Cross-temperature issues may be more prevalent in memory systems that are exposed to larger temperature gradients, such a memory systems in automotive vehicles.

A memory system may implement the techniques described herein to improve performance (e.g., reliability) in a cross-temperature scenario. For example, the memory system may identify data that is at risk of cross-temperature reliability issues and may store that data in a portion of memory (e.g., one or more blocks of memory cells) that is subject to more frequent scan operations for determining error information (e.g., compared to another portion of the memory). If a scan operation reveals that the portion of memory has a threshold error rate, the memory system may transfer the data to another block that is also subject to frequent scan operations. Thus, the memory system may effectively refresh the data (e.g., at a cadence that prevents excessive reliability issues from accumulating) as the temperature of the memory system normalizes. Upon determining that the temperature of the memory system satisfies a threshold level, the memory system may transfer the data to a portion of memory that is subject to fewer scan operations, which frees up the portion with higher-scan frequency for other data at risk of cross-temperature issues).

Figure 1:
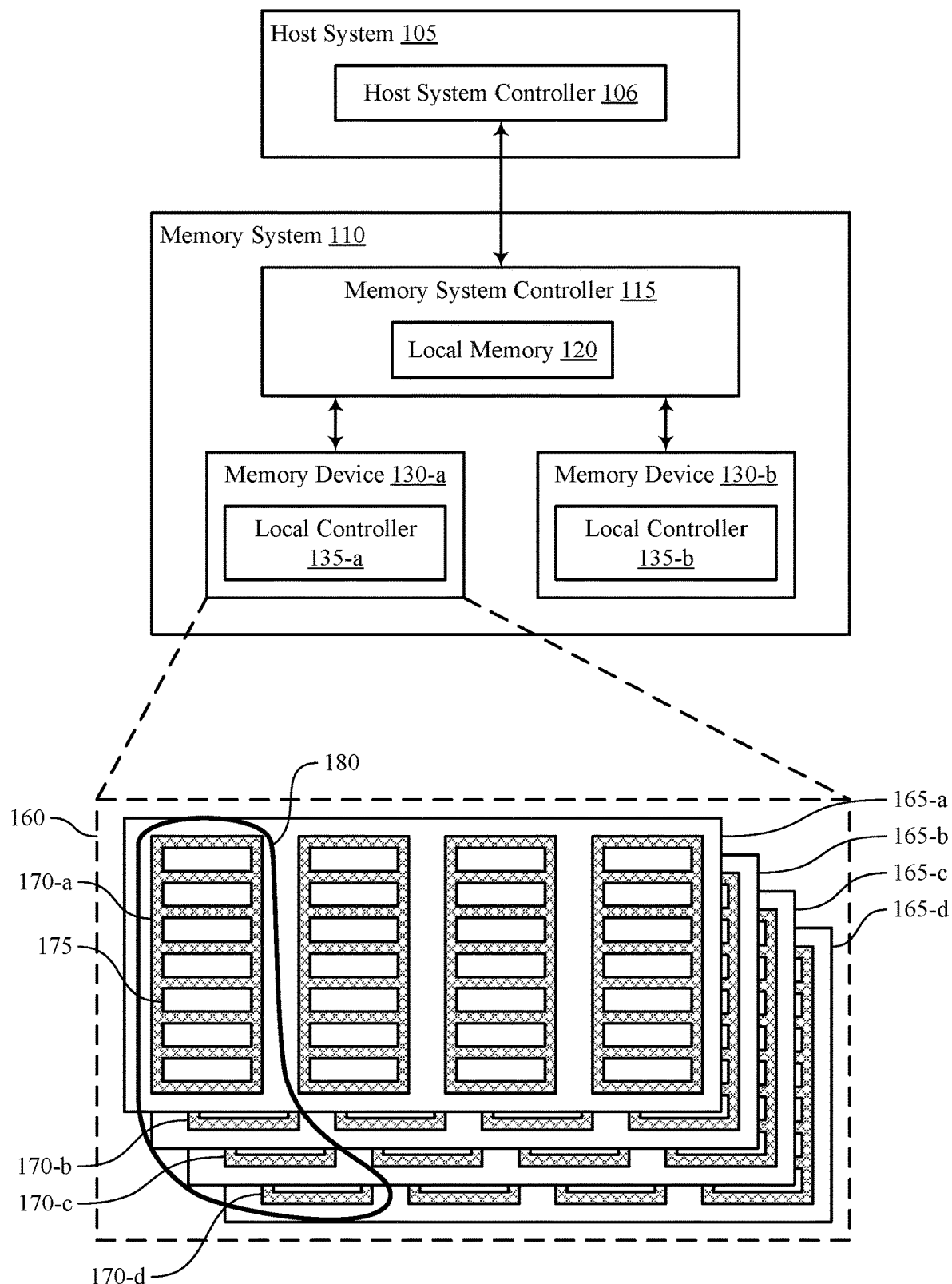
FIG. 1 illustrates an example of a system that supports cross-temperature mitigation in a memory system in accordance with examples as disclosed herein.
Figure 2:
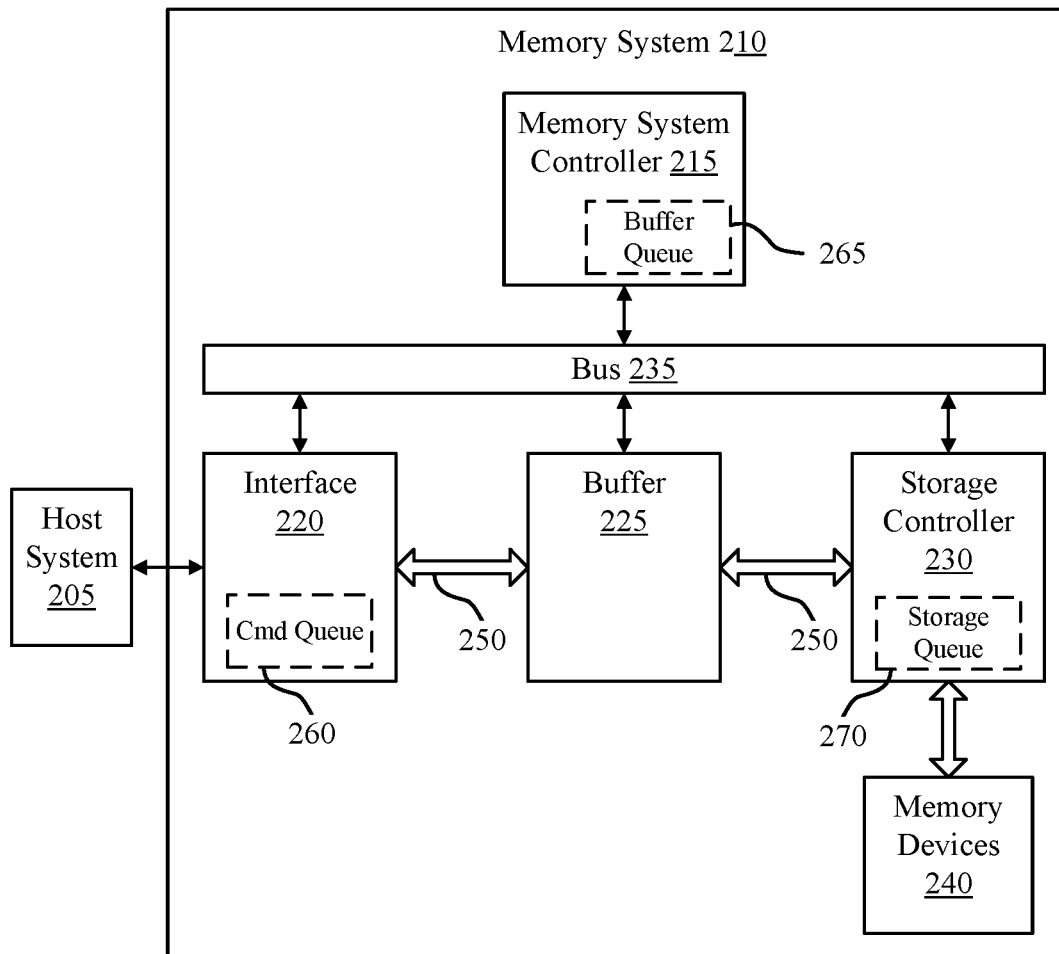
FIG. 2 illustrates an example of a system that supports cross-temperature mitigation in a memory system in accordance with examples as disclosed herein.

Features of the disclosure are initially described in the context of systems, devices, and circuits with reference to FIGS. 1 through 2. Features of the disclosure are described in the context of a system and a flow chart with reference to FIGS. 3 through 4. These and other features of the disclosure are further illustrated by and described in the context of an apparatus diagram and flowchart that relate to cross-temperature mitigation in a memory system with reference to FIGS. 5 through 6.

FIG. 1 illustrates an example of a system 100 that supports cross-temperature mitigation in a memory system in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some examples, the memory system 110 may perform scan operations (which may also be referred to as block scans) on blocks 170. A scan operation may be used to determine error information (e.g., error rate) for a block and may include reading the block and performing error detection (and possibly error correction) processing on the data read from the block. For example, as part of a scan operation the memory system 110 may perform error correction code (ECC) decoding on read data to detect and correct one or more errors in the read data. The memory system 110 may determine error information (e.g., error rate) for the memory block based on the errors detected as part of the ECC decoding. The error rate of a block may indicate a ratio of errors to read data. In some examples, the error rate if a block may be the raw bit error rate (RBER), which may be the ratio of errors to read data before ECC processing corrects for errors in the data.

According to the techniques described herein, the memory system 110 may improve reliability in cross-temperature scenarios by detecting if the write temperature for a set of data is expected to satisfy a threshold temperature. If so, the memory system 110 may write the set of data to one or more blocks 170 (which may be referred to as high scan rate blocks) that are configured to perform scan operations at high rate (also referred to as a high frequency, a high cadence, a high tempo). If a scan operation indicates that the block(s) 170 storing the set of data have a threshold error metric, the memory system 110 may transfer the set of data to another one or more high scan rate blocks 170. The memory system 110 may retain the set of data in the portion of memory that has high scan rate blocks until the memory system 110 determines that the read temperature for the set of data is expected to satisfy a threshold or be within a threshold range, at which point the memory system 110 may transfer the set of data to one or more blocks (referred to as low scan rate blocks) configured to perform scan operations at a lower rate than the high scan rate blocks.

The system 100 may include any quantity of non-transitory computer readable media that support cross-temperature mitigation in a memory system. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

FIG. 2 illustrates an example of a system 200 that supports cross-temperature mitigation in a memory system in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point or other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, after completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. After receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

After a determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, performing garbage collection). The entries may be added to the storage queue 270, e.g., by the memory system controller 215. The entries may be removed from the storage queue 270 (e.g., by the storage controller 230 or memory system controller 215) after completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed herein. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the described operations in conjunction with or instead of the memory system controller 215. In some cases, the memory system controller 215 may perform the functions of the storage controller 230 and the storage controller 230 may be omitted.

In some examples, the memory system 210 may write a set of data and read the set of data at different temperatures. To mitigate reliability issues associated with such a scenario, the memory system 210 may write the set of data (provided that the write temperature satisfies a threshold) to a high scan rate block of a memory device 240. The memory system 210 may set the rate for performing scan operations on the block based on various factors, such as the write temperature, the quantity of write operations performed on the block, the quantity of erase operations performed on the block, or any combination thereof.

The memory system 210 may then perform scan operations according to the selected rate. If a scan operation indicates that the block has a threshold error metric, the memory system 210 may copy the data from the block to another high scan rate block. Thus, the memory system 210 may effectively refresh the data as the temperature of the memory system 210 normalizes (and may do so at a cadence that prevents excessive reliability issues from accumulating). If the temperature of the memory system 210 satisfies a threshold temperature or falls within a threshold temperature range, the memory system 210 may copy the data to a low scan rate block (and thus free up the high scan rate block for other data at risk of cross-temperature issues).

Figure 3:
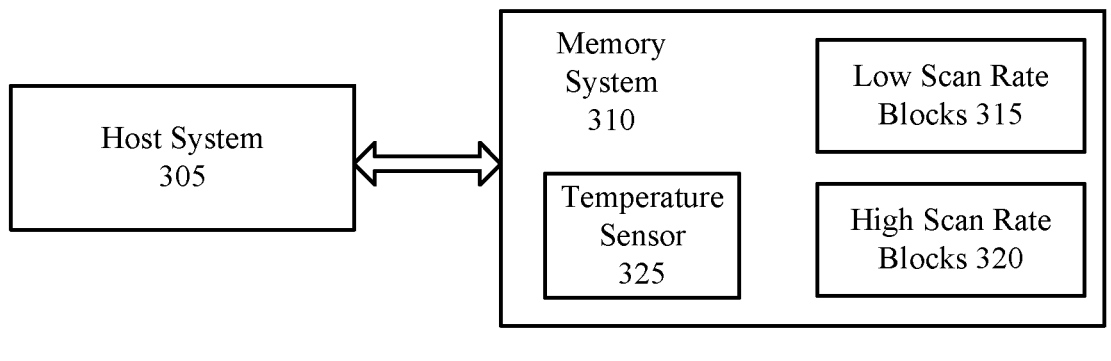
FIG. 3 illustrates an example of a system that supports cross-temperature mitigation in a memory system in accordance with examples as disclosed herein.

FIG. 3 illustrates an example of a system 300 that supports cross-temperature mitigation in a memory system in accordance with examples as disclosed herein. The system 300 may be an example of a system 100 or a system 200 as described with reference to FIGS. 1 and 2, respectively. The system 300 may include a host system 305 and a memory system 310 coupled via an interface that is configured to convey information (e.g., commands, data) between the host system 305 and the memory system 310. The memory system 310 may mitigate cross-temperature reliability issues by moving data between high scan rate blocks and low scan rate blocks according to the techniques described herein. In some examples, the memory system 310 may monitor the quantity of write operations and erase operations performance on blocks, which may also be referred to as program/erase cycles (PECs).

The memory system 310 may include blocks that are configured with different scan rates. For example, the memory system 310 may include low scan rate blocks 315 which may be configured with lower scan rates than the high scan rate blocks 320 (e.g., the scan rates for the low scan rate blocks 315 may be slower than the scan rates for the high scan rate blocks 320). In some examples, the low scan rate blocks 315 may be configured with fixed scan rate(s) that are independent of metrics such as write temperature and PECs. In some examples, the high scan rate blocks 320 may be configured with dynamic or adaptive scan rates that are based on metrics such as write temperature and PECs. The high scan rate blocks 320 may allow the memory system 310 to refresh data written at extreme temperatures at an adequate pace while the temperature of the memory system 310 normalizes (e.g., comes within a threshold range). However, scan operations may consume power and increase latency, among other drawbacks, so configuring each block as a high scan rate block may hurt the efficiency and performance of the memory system 310. Thus, the memory system 310 may include low scan rate blocks (which consume less power than high scan rate blocks) for data that is safe from cross-temperature reliability issues (e.g., data written at normal temperatures).

Upon selecting a set of data for writing, the memory system 310 may determine the temperature of the memory system 310 so that the memory system 310 can determine whether to write the set of data to the low scan rate blocks 315 or the high scan rate blocks 320. For example, the memory system 310 may determine the temperature of the memory system 310 using the temperature sensor 325.

In some examples, the memory system 310 may use the temperature of the memory system 310 as a basis for setting the scan rate for a high scan rate block selected for writing the set of data. For example, more extreme temperatures (e.g., temperatures farther from a threshold temperature range) may be associated with higher scan rates. Additionally or alternatively, the memory system 310 may use the quantity of access operations (e.g., PECs) performed on the high scan rate block as a basis for setting the scan rate. For example, higher quantities of access operations (e.g., higher PECs) may be associated with higher scan rates. Setting the scan rate for a high scan rate block based on write temperature, PECs, or both, may allow the memory system 310 to set the scan rate at an appropriate level for reliability without wasting time and power on superfluous scan operations.

If the temperature of the memory system 310 (denoted $T_{Sys}$) falls within a temperature range (e.g., if x° C.<$T_{Sys}$<y° C.), the memory system 310 may write the set of data to a low scan rate block 315. After writing the set of data to the low temperature block, the memory system 310 may perform scan operations on the block according to the scan rate of the low scan rate block. If the temperature falls outside a threshold temperature (e.g., $T_{Sys}$<x° C. or $T_{Sys}$>y° C.), the memory system 310 may write the set of data to a high scan rate block 320. After writing the set of data to the high temperature block, the memory system 310 may perform scan operations on the block according to the scan rate of the high scan rate block. If a scan operation indicates that the high scan rate block has a threshold error metric (e.g., a threshold failed bit count, a threshold error rate), the memory system 310 may transfer the set of data to another high scan rate block.

In some examples, the error metric may be a failed bit count, which may indicate a quantity of errors in a subset of the set of data. In other examples, the error metric may be an error rate that indicates a quantity of errors per unit of data. In some examples, the error rate may be the raw bit error rate (RBER) that indicates a quantity of errors per unit of data before ECC decoding. Other error metrics are contemplated and within the scope of the present disclosure.

After writing the set of data to the high temperature block, the memory system 310 may monitor the temperature of the memory system 310 to determine when to transfer the set of data to a low scan rate block 315. If the memory system 310 determines that the temperature of the memory system 310 falls within the threshold range (e.g., if x° C.<$T_{Sys}$<y° C.), the memory system 310 may transfer the set of data to a low scan rate block 315 so that the high scan rate block can be freed up for new data. Otherwise, the memory system 310 may maintain the set of data in the high scan rate blocks 320. As noted, the memory system 310 may perform scan operations on the high scan rate block(s) 320 that store the set of data while the memory system 310 waits for the temperature to normalize (e.g., enter the threshold range), which may allow the memory system 310 to selectively refresh the set of data (e.g., by transferring the set of data between high scan rate blocks 320) if a threshold error metric is satisfied.

Thus, the memory system 310 may mitigate cross-temperature reliability issues. For example, the techniques described herein may allow the memory system 310 to reduce the error rate (e.g., RBER) for data subject to severe cross temperature. The techniques described herein may also improve a RBER-related reliability metric referred to as the trigger rate margin. The trigger rate margin may be the difference between a threshold error rate for a block (e.g., given by an error rate curve) and an error rate (e.g., given by the ECC decoding limit) associated with performance below a threshold level.

Although described with reference to blocks, the techniques described herein can be implemented using any granularity of memory.

Figure 4:
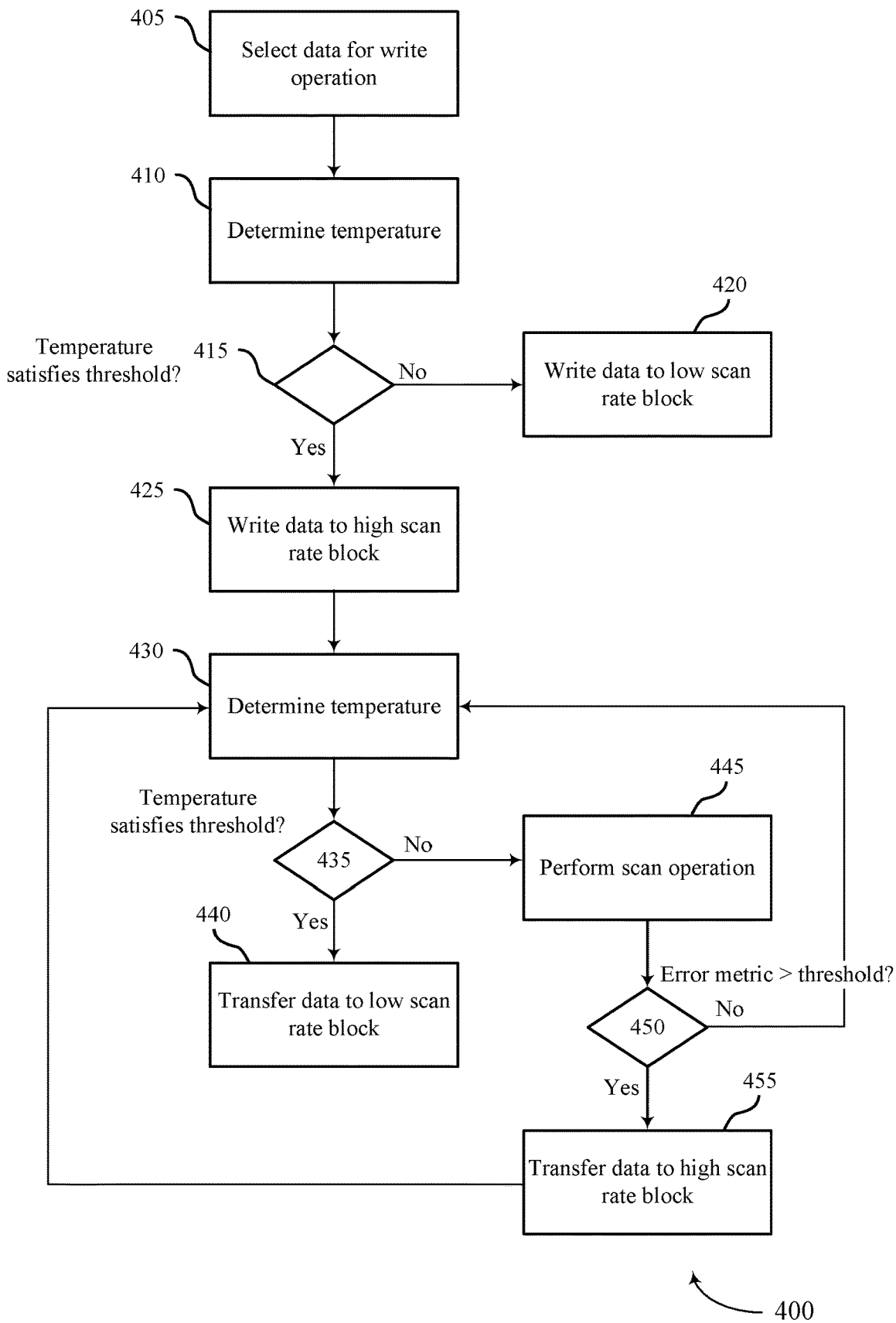
FIG. 4 illustrates an example of a flow chart that supports cross-temperature mitigation in a memory system in accordance with examples as disclosed herein.

FIG. 4 illustrates an example of a flow chart 400 that supports cross-temperature mitigation in a memory system in accordance with examples as disclosed herein. The flow chart 400 may be implemented by a memory system as described herein. For example, the flow chart 400 may be implemented by a memory system 110, a memory system 210, or a memory system 310 as described with reference to FIGS. 1, 2, and 3, respectively. Thus, the memory system may include high scan rate blocks and low scan rate blocks. By implementing aspects of the flow chart 400, the memory system may mitigate reliability issues that are associated with severe cross temperatures.

At 405, the memory system may select data for a write operation. In some examples, the data may be data that is received from a host system for writing to the memory system. At 410, the memory system may determine the temperature of the memory system. In some examples, the memory system may determine the temperature of the memory system based on (e.g., in response to) selecting the data for the write operation. Determining the temperature of the memory system may refer to measuring the temperature (e.g., using a temperature sensor) or reading a previously measured temperature from local storage (e.g., a register, a latch).

At 415, the memory system may determine whether the temperature of the memory system determined at 410 satisfies a threshold temperature. If the threshold temperature is the lower bound for a threshold range, the temperature may satisfy the threshold temperature by being less than and/or equal to the threshold temperature. If the threshold temperature is the upper bound for a threshold range, the temperature may satisfy the threshold temperature by being more than and/or equal to the threshold temperature. In some examples, the memory system may determine whether the temperature satisfies the threshold temperature based on (e.g., in response to) selecting the data for the write operation.

If, at 415, the memory system determines that the temperature determined at 410 does not satisfy the threshold temperature the memory system may, at 420, write the set of data to a low scan rate block. For example, the memory system may write the set of data to a low scan rate block if the temperature is above the lower bound for the threshold range and below the upper bound for the threshold range. After writing the set of data to the low scan rate block, the memory system may perform scan operations on the block according to the scan rate for the low scan rate block.

If, at 415, the memory system determines that the temperature determined at 410 satisfies the threshold temperature, the memory system may, at 425, write the set of data to a high scan rate block. For example, the memory system may write the set of data to a high scan rate block if the temperature is below the lower bound for the threshold range or above the upper bound for the threshold range. Before writing the set of data to the high scan rate block, the memory system may select the high scan rate block for writing and may configure the high scan rate block with a scan rate. The memory system may set the scan rate based on the write temperature associated with the set of data, based on the PECs for the high scan rate block, or both, among other metrics. In some examples, the scan rate for the low scan rate block is slower than the scan rate for the high scan rate block.

At 430, the memory system may determine the temperature of the memory system. The temperature determined at 430 may be measured after the temperature determined at 410 is measured. At 435, the memory system may determine whether the temperature of the memory system determined at 430 satisfies a threshold temperature. If the threshold temperature is the lower bound for a threshold range, the temperature may satisfy the threshold temperature by being greater than and/or equal to the threshold temperature. If the threshold temperature is the upper bound for a threshold range, the temperature may satisfy the threshold temperature by being less than and/or equal to the threshold temperature. The threshold range may be the same as or different than the threshold range used at 415.

If, at 435, the memory system determines that the temperature determined at 430 satisfies the threshold temperature, the memory system may, at 440, transfer the set of data from the high scan rate block to a low scan rate block. For example, the memory system may transfer the set of data to a low scan rate block if the temperature is above the lower bound for the threshold range or below the upper bound for the threshold range. Transferring the set of data may include reading the set of data from the high scan rate block and writing the set of data to the low scan rate block. Transferring the set of data to the low scan rate block may allow the memory system to use the high scan rate block for other sets of data at risk of cross-temperature issues. Waiting for the temperature to satisfy the threshold temperature before transferring the set of data may allow the memory system to use the high scan rate blocks to intermittently refresh the data as the temperature normalizes, which may reduce reliability issues.

If, at 435, the memory system determines that the temperature determined at 430 does not satisfy the threshold temperature, the memory system may, at 445, perform a scan operation on the high scan rate block according to the scan rate for the high scan rate block. Performing a scan operation may include reading at least a subset of the set of data from the high scan rate block and performing error detection processing on the subset of data to determine error information for the block. For example, the memory system may determine an error metric (e.g., RBER, FBR) for the high scan rate block based on the scan operation.

At 450, the memory system may determine whether the error metric for the high scan rate block satisfies (e.g., is greater than or equal to) a threshold. If, at 450, the memory system determines that the error metric does not satisfy the threshold, the memory system may refrain from transferring the set of data and may return to 430. If, at 450, the memory system determines that the error metric satisfies the threshold, the memory system may, at 455, transfer the set of data from the high scan rate block to another high scan rate block. Thus, the memory system may effectively reduce the cross temperature associated with the set of data by refreshing the set of data as the temperature of the memory system normalizes.

Figure 5:
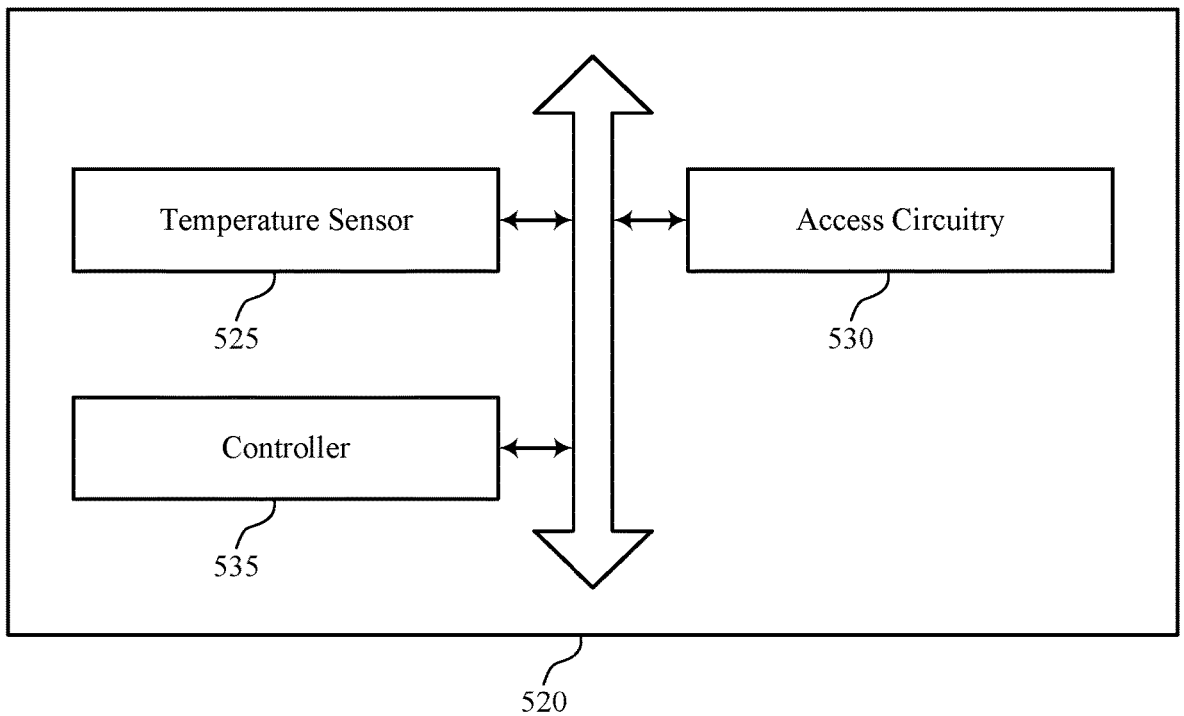
FIG. 5 shows a block diagram of a memory system that supports cross-temperature mitigation in a memory system in accordance with examples as disclosed herein.

By implementing aspects of the flow chart 400, the memory system may mitigate reliability issues that are associated with severe cross temperatures. Alternative examples of the foregoing may be implemented, where some operations are performed in a different order than described, are performed in parallel, or are not performed at all. In some cases, operations may include additional features not mentioned herein, or further operations may be added. Additionally, certain operations may be performed multiple times or certain combinations of operations may repeat or cycle FIG. 5 shows a block diagram 500 of a memory system 520 that supports cross-temperature mitigation in a memory system in accordance with examples as disclosed herein. The memory system 520 may be an example of aspects of a memory system as described with reference to FIGS. 1 through 4. The memory system 520, or various components thereof, may be an example of means for performing various aspects of cross-temperature mitigation in a memory system as described herein. For example, the memory system 520 may include a temperature sensor 525, an access circuitry 530, a controller 535, or any combination thereof. Each of these components may communicate, directly or indirectly, with one another (e.g., via one or more buses).

The temperature sensor 525 may be configured as or otherwise support a means for determining a first temperature of a memory system that includes a plurality of blocks. The access circuitry 530 may be configured as or otherwise support a means for writing, based at least in part on the first temperature satisfying a first threshold, a set of data to a first block of the plurality of blocks that is configured with a first rate for performing scan operations to determine error information for the first block. In some examples, the temperature sensor 525 may be configured as or otherwise support a means for determining a second temperature of the memory system after writing the set of data to the first block. In some examples, the access circuitry 530 may be configured as or otherwise support a means for transferring, based at least in part on the second temperature satisfying a second threshold, the set of data to a second block of the plurality of blocks that is configured with a second rate for performing scan operations to determine error information for the second block.

In some examples, the controller 535 may be configured as or otherwise support a means for determining, before determining the second temperature, an error metric for the first block based at least in part on performing a scan operation, where the error information includes the error metric. In some examples, the access circuitry 530 may be configured as or otherwise support a means for transferring, based at least in part on the error metric satisfying a threshold, the set of data from the first block to a third block of the plurality of blocks that is configured with a third rate for performing scan operations for determining error information for the third block.

In some examples, to support performing the scan operation, the access circuitry 530 may be configured as or otherwise support a means for reading at least a subset of the set of data. In some examples, to support performing the scan operation, the controller 535 may be configured as or otherwise support a means for determining one or more errors in the subset of the set of data based at least in part on reading the subset of the set of data, where the error metric is based at least in part on the one or more errors.

In some examples, the error metric includes a failed bit count that indicates a quantity of errors in the subset of the set of data or includes an error rate that indicates a quantity of errors per unit of data.

In some examples, the controller 535 may be configured as or otherwise support a means for determining that the first temperature is less than the first threshold, where the first temperature satisfies the first threshold by being less than the first threshold. In some examples, the controller 535 may be configured as or otherwise support a means for determining that the second temperature is greater than the second threshold, where the second temperature satisfies the second threshold by being greater than the second threshold.

In some examples, the controller 535 may be configured as or otherwise support a means for determining that the first temperature is greater than the first threshold, where the first temperature satisfies the first threshold by being greater than the first threshold. In some examples, the controller 535 may be configured as or otherwise support a means for determining that the second temperature is less than the second threshold, where the second temperature satisfies the second threshold by being less than the second threshold.

In some examples, the controller 535 may be configured as or otherwise support a means for determining the first rate for performing scan operations on the first block based at least in part on the first temperature of the memory system. In some examples, the controller 535 may be configured as or otherwise support a means for configuring the first block with the first rate based at least in part on determining the first rate.

In some examples, the controller 535 may be configured as or otherwise support a means for determining the first rate for performing scan operations on the first block based at least in part on a quantity of access operations performed on the first block. In some examples, the controller 535 may be configured as or otherwise support a means for configuring the first block with the first rate based at least in part on determining the first rate.

In some examples, the controller 535 may be configured as or otherwise support a means for determining a quantity of access operations performed on the first block, where the first rate for performing scan operations is based at least in part on the quantity of access operations and the first temperature of the memory system. In some examples, the controller 535 may be configured as or otherwise support a means for configuring the first block with the first rate based at least in part on determining the first rate.

In some examples, the second rate is slower than the first rate. In some examples, the set of data is transferred to the second block based at least in part on the second rate being slower than the first rate.

In some examples, the access circuitry 530 may be configured as or otherwise support a means for writing, after transferring the set of data to the second block, a second set of data to the first block of the plurality of blocks based at least in part on a third temperature of the memory system satisfying the first threshold. In some examples, the controller 535 may be configured as or otherwise support a means for configuring the first block for performing scan operations according to a third rate that is different than the first rate and that is based at least in part on the second temperature.

Figure 6:
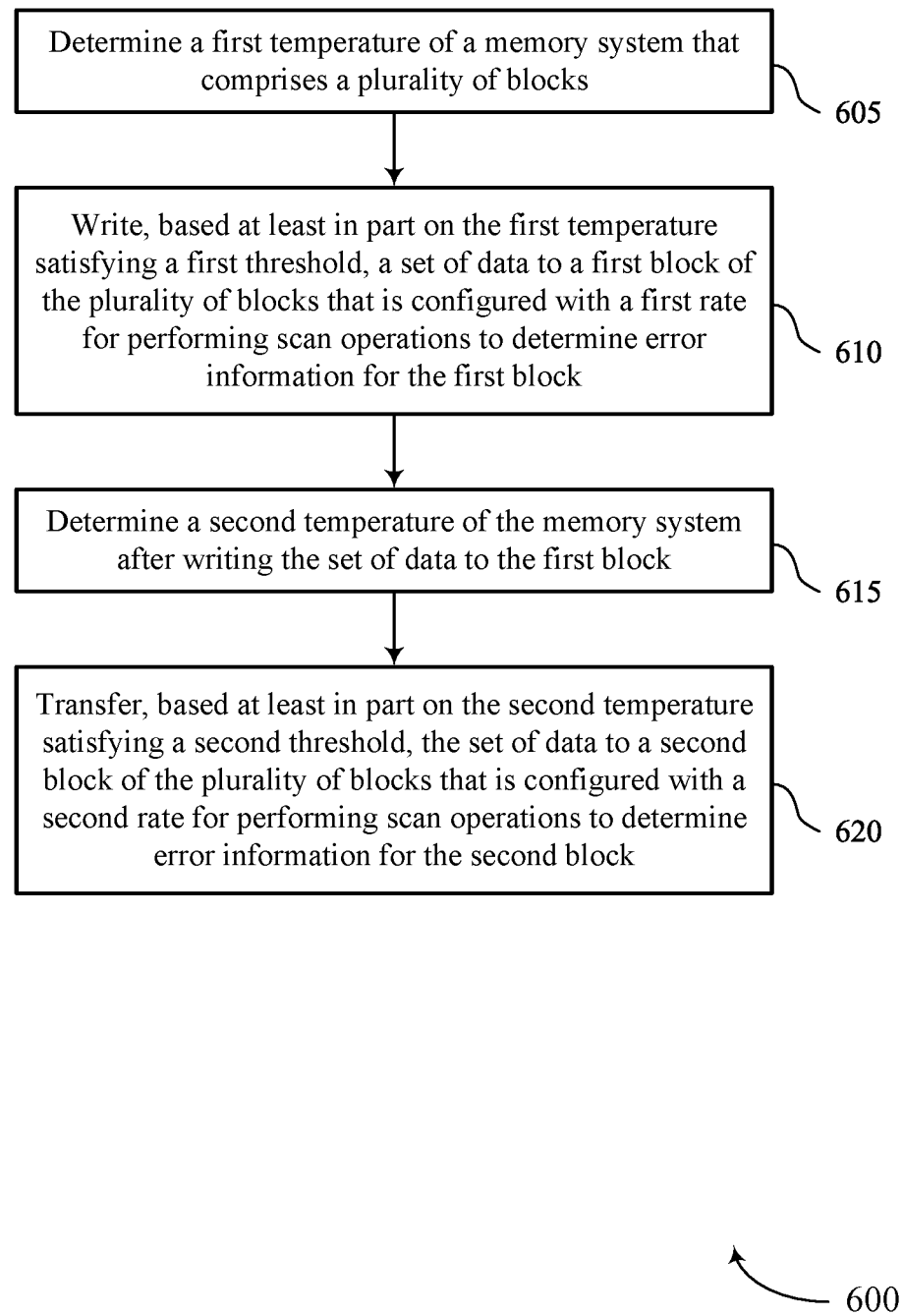
FIG. 6 shows a flowchart illustrating a method or methods that support cross-temperature mitigation in a memory system in accordance with examples as disclosed herein.

FIG. 6 shows a flowchart illustrating a method 600 that supports cross-temperature mitigation in a memory system in accordance with examples as disclosed herein. The operations of method 600 may be implemented by a memory system or its components as described herein. For example, the operations of method 600 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 605, the method may include determining a first temperature of a memory system that includes a plurality of blocks. The operations of 605 may be performed in accordance with examples as disclosed herein. In some examples, aspects of the operations of 605 may be performed by a temperature sensor 525 as described with reference to FIG. 5.

At 610, the method may include writing, based at least in part on the first temperature satisfying a first threshold, a set of data to a first block of the plurality of blocks that is configured with a first rate for performing scan operations to determine error information for the first block. The operations of 610 may be performed in accordance with examples as disclosed herein. In some examples, aspects of the operations of 610 may be performed by an access circuitry 530 as described with reference to FIG. 5.

At 615, the method may include determining a second temperature of the memory system after writing the set of data to the first block. The operations of 615 may be performed in accordance with examples as disclosed herein. In some examples, aspects of the operations of 615 may be performed by a temperature sensor 525 as described with reference to FIG. 5.

At 620, the method may include transferring, based at least in part on the second temperature satisfying a second threshold, the set of data to a second block of the plurality of blocks that is configured with a second rate for performing scan operations to determine error information for the second block. The operations of 620 may be performed in accordance with examples as disclosed herein. In some examples, aspects of the operations of 620 may be performed by an access circuitry 530 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for determining a first temperature of a memory system that includes a plurality of blocks; writing, based at least in part on the first temperature satisfying a first threshold, a set of data to a first block of the plurality of blocks that is configured with a first rate for performing scan operations to determine error information for the first block; determining a second temperature of the memory system after writing the set of data to the first block; and transferring, based at least in part on the second temperature satisfying a second threshold, the set of data to a second block of the plurality of blocks that is configured with a second rate for performing scan operations to determine error information for the second block.

Aspect 2: The method, apparatus, or non-transitory computer-readable medium of aspect 1, further including operations, features, circuitry, logic, means, or instructions, or any combination thereof for determining, before determining the second temperature, an error metric for the first block based at least in part on performing a scan operation, where the error information includes the error metric and transferring, based at least in part on the error metric satisfying a threshold, the set of data from the first block to a third block of the plurality of blocks that is configured with a third rate for performing scan operations for determining error information for the third block.

Aspect 3: The method, apparatus, or non-transitory computer-readable medium of aspect 2, where performing the scan operation includes operations, features, circuitry, logic, means, or instructions, or any combination thereof for reading at least a subset of the set of data and determining one or more errors in the subset of the set of data based at least in part on reading the subset of the set of data, where the error metric is based at least in part on the one or more errors.

Aspect 4: The method, apparatus, or non-transitory computer-readable medium of any of aspects 2 through 3, where the error metric includes a failed bit count that indicates a quantity of errors in the subset of the set of data or includes an error rate that indicates a quantity of errors per unit of data.

Aspect 5: The method, apparatus, or non-transitory computer-readable medium of any of aspects 1 through 4, further including operations, features, circuitry, logic, means, or instructions, or any combination thereof for determining that the first temperature is less than the first threshold, where the first temperature satisfies the first threshold by being less than the first threshold and determining that the second temperature is greater than the second threshold, where the second temperature satisfies the second threshold by being greater than the second threshold.

Aspect 6: The method, apparatus, or non-transitory computer-readable medium of any of aspects 1 through 5, further including operations, features, circuitry, logic, means, or instructions, or any combination thereof for determining that the first temperature is greater than the first threshold, where the first temperature satisfies the first threshold by being greater than the first threshold and determining that the second temperature is less than the second threshold, where the second temperature satisfies the second threshold by being less than the second threshold.

Aspect 7: The method, apparatus, or non-transitory computer-readable medium of any of aspects 1 through 6, further including operations, features, circuitry, logic, means, or instructions, or any combination thereof for determining the first rate for performing scan operations on the first block based at least in part on the first temperature of the memory system and configuring the first block with the first rate based at least in part on determining the first rate.

Aspect 8: The method, apparatus, or non-transitory computer-readable medium of any of aspects 1 through 7, further including operations, features, circuitry, logic, means, or instructions, or any combination thereof for determining the first rate for performing scan operations on the first block based at least in part on a quantity of access operations performed on the first block and configuring the first block with the first rate based at least in part on determining the first rate.

Aspect 9: The method, apparatus, or non-transitory computer-readable medium of any of aspects 1 through 8, further including operations, features, circuitry, logic, means, or instructions, or any combination thereof for determining a quantity of access operations performed on the first block, where the first rate for performing scan operations is based at least in part on the quantity of access operations and the first temperature of the memory system and configuring the first block with the first rate based at least in part on determining the first rate.

Aspect 10: The method, apparatus, or non-transitory computer-readable medium of any of aspects 1 through 9, where the second rate is slower than the first rate and the set of data is transferred to the second block based at least in part on the second rate being slower than the first rate.

Aspect 11: The method, apparatus, or non-transitory computer-readable medium of any of aspects 1 through 10, further including operations, features, circuitry, logic, means, or instructions, or any combination thereof for writing, after transferring the set of data to the second block, a second set of data to the first block of the plurality of blocks based at least in part on a third temperature of the memory system satisfying the first threshold and configuring the first block for performing scan operations according to a third rate that is different than the first rate and that is based at least in part on the second temperature.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   determining a first temperature of a memory system that comprises a first block configured with a first rate for performing scan operations and a second block configured with a second rate for performing scan operations;
   selecting, for writing a set of data and based at least in part on the first temperature falling outside of a first threshold range, the first block based at least in part on the first block being configured with the first rate for performing scan operations to determine error information for the first block;
   determining a second temperature of the memory system after writing the set of data to the first block;
   determining to transfer the set of data from the first block based at least in part on the second temperature and the first rate for performing scan operations; and
   selecting, for transferring the set of data from the first block and based at least in part on the second temperature falling within a second threshold range, the second block based at least in part on the second block being configured with the second rate, for performing scan operations to determine error information for the second block, that is slower than the first rate.

2. The method of claim 1, further comprising:
   determining, before determining the second temperature, an error metric for the first block based at least in part on performing a scan operation, wherein the error information comprises the error metric; and
   transferring, based at least in part on the error metric satisfying a threshold, the set of data from the first block to a third block that is configured with a third rate for performing scan operations for determining error information for the third block.

3. The method of claim 2, wherein performing the scan operation comprises:
   reading at least a subset of the set of data; and
   determining one or more errors in the subset of the set of data based at least in part on reading the subset of the set of data, wherein the error metric is based at least in part on the one or more errors.

4. The method of claim 3, wherein the error metric comprises a failed bit count that indicates a quantity of errors in the subset of the set of data or comprises an error rate that indicates a quantity of errors per unit of data.

5. The method of claim 1, wherein the first threshold range is equal to the second threshold range, the method further comprising:
   determining that the first temperature is less than a lower bound of the first threshold range; and
   determining that the second temperature is greater than the lower bound of the second threshold range.

6. The method of claim 1, wherein the first threshold range is equal to the second threshold range, the method further comprising:
   determining that the first temperature is greater than an upper bound of the first threshold range; and
   determining that the second temperature is less than the upper bound of the second threshold range.

7. The method of claim 1, further comprising:
   determining the first rate for performing scan operations on the first block based at least in part on the first temperature of the memory system; and
   configuring the first block with the first rate based at least in part on determining the first rate.

8. The method of claim 1, further comprising:
   determining the first rate for performing scan operations on the first block based at least in part on a quantity of access operations performed on the first block; and
   configuring the first block with the first rate based at least in part on determining the first rate.

9. The method of claim 1, further comprising:
   determining a quantity of access operations performed on the first block, wherein the first rate for performing scan operations is based at least in part on the quantity of access operations and the first temperature of the memory system; and
   configuring the first block with the first rate based at least in part on determining the first rate.

10. The method of claim 1, further comprising:
    writing, after transferring the set of data to the second block, a second set of data to the first block based at least in part on a third temperature of the memory system falling outside of the first threshold range; and
    configuring the first block for performing scan operations according to a third rate that is different than the first rate and that is based at least in part on the second temperature.

11. A memory system, comprising:
    one or more memory devices comprising a first block configured with a first rate for performing scan operations and a second block configured with a second rate for performing scan operations; and
    one or more controllers coupled with the one or more memory devices and configured to cause the memory system to:
      determine a first temperature of the memory system;
      select, for writing a set of data, based at least in part on the first temperature falling outside of a first threshold range, the first block based at least in part on the first block being configured with the first rate for performing scan operations to determine error information for the first block;
      determine a second temperature of the memory system after writing the set of data to the first block;
      determine to transfer the set of data from the first block based at least in part on the second temperature and the first rate for performing scan operations; and
      select, for transferring the set of data from the first block and based at least in part on the second temperature falling within a second threshold range, the second block is based at least in part on the second block being configured with the second rate, for performing scan operations to determine error information for the second block, that is slower than the first rate.

12. The memory system of claim 11, wherein the one or more controllers is further configured to cause the memory system to:
    determine, before determining the second temperature, an error metric for the first block based at least in part on performing a scan operation, wherein the error information comprises the error metric; and
    transfer, based at least in part on the error metric satisfying a threshold, the set of data from the first block to a third block that is configured with a third rate for performing scan operations for determining error information for the third block.

13. The memory system of claim 12, wherein the one or more controllers is configured to cause the memory system to perform the scan operation by being configured to cause the memory system to:
    read at least a subset of the set of data; and
    determine one or more errors in the subset of the set of data based at least in part on reading the subset of the set of data, wherein the error metric is based at least in part on the one or more errors.

14. The memory system of claim 13, wherein the error metric comprises a failed bit count that indicates a quantity of errors in the subset of the set of data or comprises an error rate that indicates a quantity of errors per unit of data.

15. The memory system of claim 11, wherein the first threshold range is equal to the second threshold range, and wherein the one or more controllers is further configured to cause the memory system to:
    determine that the first temperature is less than a lower bound of the first threshold range; and
    determine that the second temperature is greater than the lower bound of the second threshold range.

16. The memory system of claim 11, wherein the first threshold range is equal to the second threshold range, and wherein the one or more controllers is further configured to cause the memory system to:
    determine that the first temperature is greater than an upper bound of the first threshold range; and
    determine that the second temperature is less than the upper bound of the second threshold range.

17. A non-transitory, computer-readable medium storing code comprising instructions which, when executed by a processor of a memory system, cause the memory system to:
- determine a first temperature of the memory system that comprises a first block configured with a first rate for performing scan operations and a second block configured with a second rate for performing scan operations;
- select, for writing a set of data, and based at least in part on the first temperature falling outside of a first threshold range, the first block based at least in part on the first block being configured with the first rate for performing scan operations to determine error information for the first block;
- determine a second temperature of the memory system after writing the set of data to the first block;
- determine to transfer the set of data from the first block based at least in part on the second temperature and the first rate for performing scan operations; and
- select, for transferring the set of data from the first block and based at least in part on the second temperature falling within a second threshold range, the second block based at least in part on the second block being configured with the second rate, for performing scan operations to determine error information for the second block, that is slower than the first rate.

18. The non-transitory, computer-readable medium of claim 17, wherein the instructions, when executed by the processor, further cause the memory system to:
- determine, before determining the second temperature, an error metric for the first block based at least in part on performing a scan operation, wherein the error information comprises the error metric; and
- transfer, based at least in part on the error metric satisfying a threshold, the set of data from the first block to a third block that is configured with a third rate for performing scan operations for determining error information for the third block.

19. The non-transitory, computer-readable medium of claim 18, wherein the instructions, when executed by the processor to cause the memory system to perform the scan operation, cause the memory system to:
- read at least a subset of the set of data; and
- determine one or more errors in the subset of the set of data based at least in part on reading the subset of the set of data, wherein the error metric is based at least in part on the one or more errors.

20. The non-transitory, computer-readable medium of claim 19, wherein the error metric comprises a failed bit count that indicates a quantity of errors in the subset of the set of data or comprises an error rate that indicates a quantity of errors per unit of data.

21. The non-transitory, computer-readable medium of claim 17, wherein the first threshold range is equal to the second threshold range, and wherein the instructions, when executed by the processor, further cause the memory system to:
- determine that the first temperature is less than a lower bound of the first threshold range; and
- determine that the second temperature is greater than the lower bound of the second threshold range.

* * * * *